United States Patent [19]

Boyd et al.

[11] 4,436,580

[45] Mar. 13, 1984

[54] METHOD OF PREPARING A MERCURY CADIUM TELLURIDE SUBSTRATE FOR PASSIVATION AND PROCESSING

[75] Inventors: Phillip R. Boyd, Upper Marlboro, Md.; Gary K. Green, Fredericksburg; Barbara E. Sumner, Alexandria, both of Va.

[73] Assignee: The United States of America as represented by the Secretary of the Army, Washington, D.C.

[21] Appl. No.: 522,775

[22] Filed: Aug. 12, 1983

[51] Int. Cl.³ ................ H01L 21/306; B44C 1/22; C03C 15/00; C03C 25/06

[52] U.S. Cl. .................... 156/636; 156/639; 156/650; 252/79.1; 427/76; 427/309

[58] Field of Search .............. 29/572; 136/243, 260, 136/264; 156/636, 639, 645, 650, 651, 903; 252/79.1; 427/74, 76, 309

[56] References Cited

U.S. PATENT DOCUMENTS

| | | | |
|---|---|---|---|
| 3,671,313 | 6/1972 | Reynolds | 427/76 X |
| 3,902,924 | 9/1975 | Maciolek et al. | 148/1.5 |
| 4,261,802 | 4/1981 | Fulop et al. | 427/76 X |

*Primary Examiner*—William A. Powell
*Attorney, Agent, or Firm*—Robert P. Gibson; Milton W. Lee; Max L. Harwell

[57] ABSTRACT

A method of preparing a mercury cadmium telluride substrate with a cadmium telluride surface of less than 200 Å to yield a surface exhibiting improved quality and smaller variation in the x-valve of a $Hg_{1-x}Cd_xTe$ substrate for passivation and processing of the CdTe processed surface. The method comprises the steps of etching said $Hg_{1-x}Cd_xTe$ substrate with a bromine methanol or bromine-DMF etch, quenching the substrate in methanol or DMF until the bromine is removed and rinsing in acetone and methanol to remove soluble residuals and drying immediately, coating said substrate with CdTe layer of about 1000 Å, polishing the processed CdTe layer by a contactless polishing means using a polishing solution of 50% ethylene glycol and 50% mixture of 2% bromine and 98% methanol wherein said CdTe layer is polished down to generally less than 200 Å according the monitored condition of the CdTe layer, and repeating the quenching, rinsing and drying steps to remove all bromine and soluble residuals.

6 Claims, 1 Drawing Figure

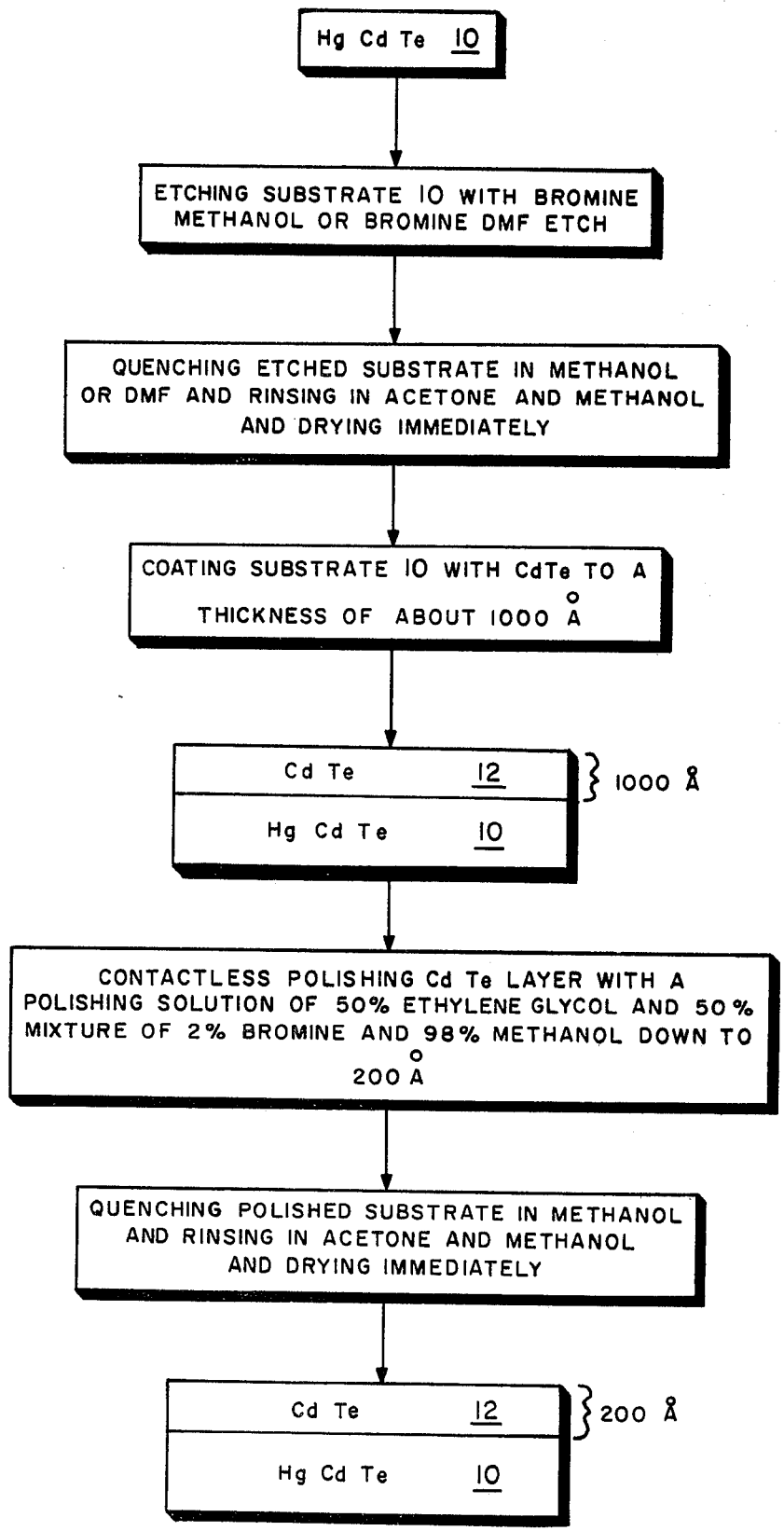

METHOD OF PREPARING A MERCURY CADMIUM TELLURIDE SUBSTRATE FOR PASSIVATION AND PROCESSING

The invention described herein may be manufactured, used, licensed by the U.S. Government for governmental purposes without the payment of any royalties thereon.

BACKGROUND OF THE INVENTION

1. Field of the Invention.

The invention relates to a method for preparing HgCdTe substrate surface layers in order to reduce the surface damage that is typical of HgCdTe surfaces regardless of the growth or surface preparation techniques.

2. Description of the Prior Art.

$Hg_{1-x}Cd_xTe$ is a compound semiconductor with potential to meet the requirements of many infrared detector applications. This is mainly due to it's tunable bandgap, which determines its spectral operating range and it's long wavelength cutoff. The bandgap of HgCdTe can be continuously varied for 0. to 1.6 eV by changing the relative concentrations of HgTe and CdTe, i.e., changing the x-value function to utilize the tunability of the energy gap. However, the surface of HgCdTe alloys provides sites for generation-recombination which, in turn, severly limit the performance of these alloys for many infrared detector applications. Improperly treated HgCdTe device surfaces can be a source of leakage currents, excessive 1/f noise, and device instability both chemically and electrically with time. Consequently, it is necessary to prepare a high quality surface on HgCdTe device materials in order to reduce the surface leakage currents as well as to maintain the chemical and electrical stability.

The continued development of HgCdTe ternary alloys is becoming increasingly important as a source of sensor materials for advanced infrared focal plane applications. The advancement of this technology requires improved $H_{1-x}Cd_xTe$ material preparation methods, i.e., surface processing and growth techniques, as well as surface passivations and junction formation processes. Surface quality remains a critical limitation in $Hg_{1-x}Cd_xTe$ detector fabrication. The depth of the damaged surface layer from surface processing of HgCdTe wafers is a function of the processing techniques, that is whether one does straight chemical etching, chemical-mechanical polishing or contactless polishing of the material surface. Many of the previous processes left a damaged surface layer which extended to a depth of 1000 Å or more into the $Hg_{1-x}Cd_xTe$ material. One approach for reducing the level of surface damage is to anodize the $Hg_{1-x}Cd_xTe$ surface using a wet chemical approach and then to consume the damaged surface region by an appropriate etching technique. However, the depth of the anodization must be very accurately controlled however to prevent shifting of the damage, underlying near surface bulk $Hg_{1-x}Cd_xTe$ material, further into the bulk $Hg_{1-x}Cd_xTe$. The long term wet etching of $Hg_{1-x}Cd_xTe$ surfaces also changes the surfaces stoichiometry, which impacts device passivation and surface leakage phenomena. Therefore, this approach to improved surface quality for $Hg_{1-x}Cd_xTe$ alloys is far from satisfactory.

The present method of preparing an improved $Hg_{1-x}Cd_xTe$ surface layer is disclosed herein below.

SUMMARY OF THE INVENTION

The present invention is a method for improving the surface quality of $Hg_{1-x}Cd_xTe$ layers for device applications by depositing cadmium telluride thereon to about 1000 Å depth followed by a subsequent removal of the CdTe layer by contactless polishing to yield surfaces having improved quality and smaller variations in composition, i.e., small variations in x-value. The original $Hg_{1-x}Cd_xTe$ wafer may be the result of bulk, liquid phase epitaxial or chemical vapor deposition crystal growth techniques, and may be either n- or p-majority barrier type and not suffer deleterious effects from the CdTe process described in the present method.

Electrolyte electroreflectance tests of the surface quality for $Hg_{1-x}Cd_xTe$ substrates resulting from the present method have demonstrated excellent surface quality and x-value homogeniety for the approximately 2000 Å sampling depth of this measurement for $Hg_{1-x}Cd_xTe$ substrates processed according to this invention, whereas in prior art $Hg_{1-x}Cd_xTe$ surfaces the damage and x-value non-uniformity starts at the surface and extends as far as 200 Å into the $Hg_{1-x}Cd_xTe$ surface.

The present method of preparing a high quality $Hg_{1-x}Cd_xTe$ surface will be better understood with reference to the detailed description of the preferred embodiment and the following lone FIGURE drawing.

BRIEF DESCRIPTION OF THE DRAWING

The single FIGURE of the drawing illustrates the steps by block diagram and the layered substrate involved in the method of preparing the surface of a $Hg_{1-x}Cd_xTe$ substrate for passivation and further processing.

DETAILED DESCRIPTION OF THE PREFERRED EMBODIMENT

The inventive method is herein after described by reference to the lone FIGURE drawing. A mercury cadmium telluride substrate 10 is provided having the composition $Hg_{1-x}Cd_xTe$. Substrate 10 may be prepared by any convenient means for producing high quality $Hg_{1-x}Cd_xTe$, such as bulk crystal growth techniques, liquid phase epitaxy, or chemical vapor deposition. The method is comprised of first etching the $Hg_{1-x}Cd_xTe$ substrate with a bromine methanol or bromine N,N-Dimethylformide (DMF) solution by means, such as dip etching using a 2% bromine and 98% solution (V/V) or an appropriate bromine N,N-Dimethylformide solution, by placing said substrate 10 in a holder with the process side of 10 up and dipping into either of the indicated etching solutions for about 20-45 seconds. The etched substrate is then quenched in methanol for the bromine-methanol etch or DMF for the bromine-DMF etch until all traces of the bromine are removed. The substrate is next rinsed in acetone and methanol, to remove soluble residual contamination and is immediately dried with dry nitrogen.

The next step in preparing the $Hg_{1-x}Cd_xTe$ substrate is to coat the substrate with a layer of cadmium telluride 12 in a coating system which is evacuated to about $2-5 \times 10^{-7}$ Torr. The CdTe layer 12 is deposited on the etched $Hg_{1-x}Cd_xTe$ at about 10-12 Å per second until about 1000 Å is deposited thereon. The step of coating the substrate 10 may be accomplished by the electron beam evaporation method, thermal evaporation, or by means of sputtering techniques.

The processed layer 12 of CdTe is next polished by a contactless polishing means down to less than 200 Å. The contactless polishing may be accomplished by mounting the substrate 10 on a rotatable disc and placing it processed face down just above a rotatable polishing pad. The two discs are rotated while a continuous flow of a polishing solution is supplied to the discs. The polishing solution is preferably comprised of 50% ethylene glycol and 50% of a mixture of 2% bromine and 98% methanol.

Even though the inventive method has been described in detail with particular reference to preferred embodiments thereof, it will be understood that variations and modifications can be effected within the spirit and scope of the invention.

We claim:

1. A method of preparing a mercury cadmium telluride substrate for passivation and processing, said method comprising the steps of:
    providing an $Hg_{1-x}Cd_xTe$ substrate;
    etching said substrate with a bromine methanol etch until the surface of said substrate is free of visible oxides and residual impurities;
    quenching the etched substrate until all traces of bromine is removed and rinsing in acetone and methanol to remove soluble residuals and drying immediately;
    coating said $Hg_{1-x}Cd_xTe$ substrate with CdTe in a coating system evacuated down to about $2-5\times10^{-7}$ Torr wherein said CdTe is deposited on said substrate at about 10-12 Å per second to a thickness of about 1000 Å;
    polishing the processed CdTe layer of said substrate by a contactless polish means having a polishing solution comprised of 50% ethylene glycol and 50% methanol and bromine mixture of 2% bromine and 98% methanol, wherein said CdTe layer is polished down to generally less than 200 Å; and
    quenching the polished substrate in methanol until all traces of bromine is removed and rinsing in acetone and methanol to remove soluble residuals and drying the substrate immediately whereby the quality of the $Hg_{1-x}Cd_xTe$ layers is improved by the CdTe processing steps to yield a surface exhibiting improved quality and smaller variations in composition or x-valve.

2. A method as set forth in claim 1 wherein said step of providing an $Hg_{1-x}Cd_xTe$ substrate is prepared by one of the techniques comprised of crystal growth techniques, liquid phase epitaxy, and chemical vapor deposition.

3. A method as set forth in claim 1 wherein said step of etching said substrate with a bromine etch is a dip etching method using a 2% bromine and 98% methanol solution by placing said substrate in a holder means with the process side up and dipping into said bromine methanol solution for about 20-45 seconds and said quenching step is quenching the etched substrate in methanol.

4. A method as set forth in claim 1 wherein said step of etching said substrate with a bromine etch is a dip etching method using an appropriate bromine and DMF solution by placing said substrate in a holder means with the process side up and dipping into said bromine DFM solution for about 20-45 seconds and said quenching step is quenching the etched substrate in DMF.

5. A method as set forth in claim 3 wherein said step of coating said $Hg_{1-x}Cd_xTe$ substrate with CdTe is by electron beam evaporation method.

6. A method as set forth in claim 4 wherein said step of contactless polishing the processed CdTe layer is by mounting said substrate on a rotatable disc and placing just above a polishing pad and processing the surface facing said polishing pad and rotating said rotatable disc just about said polishing pad while applying a continuous flow of said polishing solution to the processing side of said substrate surface for a period of about 10 minutes depending on processing surface conditions as determined by monitoring means to determine the thickness and surface conditions of said processing side.

* * * * *